US008848439B2

United States Patent
Zhang et al.

(10) Patent No.: US 8,848,439 B2
(45) Date of Patent: Sep. 30, 2014

(54) THRESHOLD OPTIMIZATION FOR FLASH MEMORY

(75) Inventors: Fan Zhang, Milpitas, CA (US); Ming Jin, Fremont, CA (US); Abdel-Hakim S. Alhussien, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 139 days.

(21) Appl. No.: 13/593,811

(22) Filed: Aug. 24, 2012

(65) Prior Publication Data

US 2014/0056067 A1 Feb. 27, 2014

(51) Int. Cl.
*G11C 11/34* (2006.01)
*G11C 16/04* (2006.01)

(52) U.S. Cl.
USPC ............. 365/185.03; 365/185.24; 365/185.33

(58) Field of Classification Search
CPC .............. G06F 12/0246; G06F 17/18; H01L 2924/13091; G11C 27/005; G11C 13/0069; G11C 11/56; G11C 2213/79
USPC ........................... 365/185.03, 185.24, 185.33
See application file for complete search history.

(56) References Cited

U.S. PATENT DOCUMENTS 6,188,603 B1 * 2/2001 Takeda ..................... 365/185.09
2001/0010086 A1 * 7/2001 Katayama et al. ............ 714/718
2003/0227811 A1 * 12/2003 Sugiura et al. ................ 365/222
2009/0168512 A1 * 7/2009 Ise ............................ 365/185.2
2012/0096234 A1 4/2012 Jiang et al.

OTHER PUBLICATIONS

Peleato, B. ; Agarwal, R. ; Cioffi, J. , Statistical Signal Processing Workshop (SSP), 2012 IEEE , Digital Object Identifier: 10.1109/SSP.2012.6319823 , Publication Year: 2012 , pp. 788-791.*
Microsoft Windows XP CD, https://www.google.com/#q=windows+xp&tbm=shop.*

* cited by examiner

*Primary Examiner* — Douglas King
*Assistant Examiner* — Ajay Ojha
(74) *Attorney, Agent, or Firm* — Hamilton DeSanctis & Cha

(57) ABSTRACT

Described embodiments provide enhanced read accuracy of a multi-level cell (MLC) flash memory. A read request for desired cells is received by a media controller of the memory. The media controller sets m thresholds to initial values, each threshold corresponding to a cell voltage level of the memory, and measures the cell voltage level of a given cell. For each of the desired cells of the memory, the media controller iteratively, until the measured cell voltage level converges on one of the thresholds, compares the measured cell voltage level to the thresholds. If the measured cell voltage level does not converge on one of the thresholds, the media controller updates the thresholds, remeasures the cell voltage level and compares the remeasured cell voltage level to the updated thresholds. Once the measured cell voltage level converges on a threshold, the media controller determines a binary level of the cell.

16 Claims, 8 Drawing Sheets

THRESHOLD OPTIMIZATION FOR FLASH MEMORY

BACKGROUND

Flash memory is a type of non-volatile memory that is electrically erasable and re-programmable. Flash memory is a specific type of electrically erasable programmable read-only memory (EEPROM) that is programmed and erased in large blocks. One commonly employed type of flash memory technology is NAND flash memory. NAND flash memory exhibits fast erase and write times, requires small chip area per cell, and has high endurance. Due to a greater storage capacity and lower cost than similar technologies, NAND flash memory forms the core of the flash memory available today, especially for removable universal serial bus (USB) storage devices and memory cards.

Flash memory stores information in an array of memory cells made from floating gate transistors. These transistors can hold their voltage level, also referred to as charge, for long periods of time, on the order of years, without external power being supplied. In single-level cell (SLC) flash memory, each cell stores one bit of information. In multi-level cell (MLC) flash memory, each cell can store more than one bit per cell by choosing between multiple levels of electrical charge to apply to the floating gates of its cells. MLC NAND flash memory employs multiple voltage levels per cell with a serially linked transistor arrangement to allow more bits to be stored using the same number of transistors. Most MLC NAND flash memory employs four possible states per cell, and can thus store two bits of information per cell. This level increase per cell causes cell-to-cell interference and retention noise to become more severe, which reduces the amount of voltage margin separating each voltage level and might increase the bit error ratio (BER). Software complexity might be increased to compensate for a larger BER, for example by employing an error correction code (ECC) such as Bose-Chaudhuri-Hocquenghem (BCH), Reed-Solomon (RS), and Low-Density Parity-Check (LDPC). Thus, there is a need to achieve lower BERs and increased performance of MLC NAND flash memory

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide enhanced memory read accuracy of a multi-level cell (MLC) flash memory. A read request is received by a media controller of the MLC flash memory corresponding to one or more desired cells. The media controller sets m threshold levels to initial values, each of the threshold levels corresponding to a cell voltage level of the MLC flash memory and measures the cell voltage level of a given desired cell. For each of the desired cells of the MLC flash memory, the media controller iteratively, until the measured cell voltage level converges on one of the threshold levels, compares the measured cell voltage level to the m threshold levels. If the measured cell voltage level does not converge on one of the m threshold levels, the media controller updates one or more of the m threshold levels, remeasures the cell voltage level and compares the remeasured cell voltage level to the updated m threshold levels. Once the measured cell voltage level converges on one of the m threshold levels, the media controller determines a binary level of the cell.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical.

DETAILED DESCRIPTION

In accordance with described embodiments, a method of enhancing the memory read accuracy of multi-level cell NAND flash memory is provided. The cell level voltages might be measured multiple times and compared to one or more thresholds. In the event that the measurements and thresholds do not converge, a Markov Decision Process (MDP) is applied incrementally until convergence, reducing memory read errors.

Table 1 summarizes a list of acronyms employed throughout this specification as an aid to understanding described embodiments:

TABLE 1

| BCH | Bose-Chaudhuri-Hocquenghem | BER | Bit Error Rate |
|---|---|---|---|
| ECC | Error Correction Code | EEPROM | electrically erasable programmable read-only memory |
| IC | Integrated Circuit | LDPC | Low-Density Parity-Check |
| LLR | Log-Likelihood Ratio | MLC | Multi-Level Cell |
| RAM | Random Access Memory | RS | Reed-Solomon |
| SAS | Serial Attached SCSI | SATA | Serial Advanced Technology Attachment |
| SCSI | Small Computer System Interface | SLC | Single Level Cell |
| SoC | System on Chip | USB | Universal Serial Bus |

Figure 1:
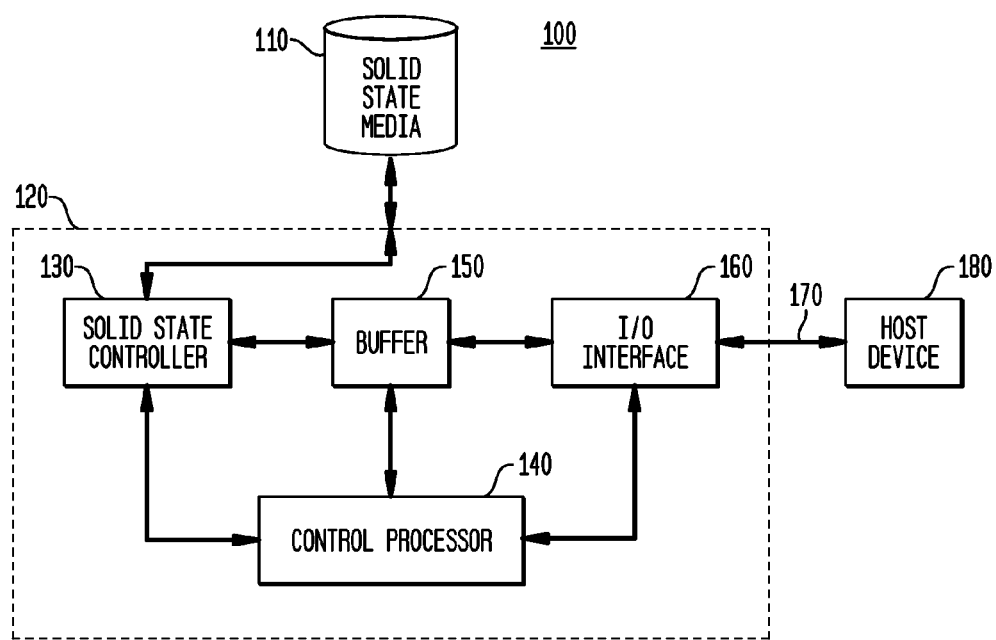
FIG. 1 shows a block diagram of a flash memory storage system in accordance with exemplary embodiments.

FIG. 1 shows a block diagram of flash memory storage system 100. Flash memory storage system 100 includes solid state media 110, which is coupled to memory controller 120. Memory controller 120 includes solid state controller 130, control processor 140, buffer 150 and I/O interface 160. Memory controller 120 controls transfer of data between solid state media 110 and host device 180 that is coupled to communication link 170. Memory controller 120 might be implemented as a system-on-chip (SoC) or other integrated circuit (IC). Solid state controller 130 might be used to access memory locations in solid state media 110, and might typically implement low-level, device specific operations to interface with solid state media 110. Buffer 150 might be a RAM buffer employed to act as a cache for control processor 140 or as a read/write buffer for operations between solid state media 110 and host device 180. Buffer 150 might be employed to group or split data to account for differences between a data transfer size of communication link 170 and a storage unit size (e.g., page size or sector size) of solid state media 110.

Control processor 140 communicates with solid state controller 130 to control data access (e.g., read or write operations) data in solid state media 110. Control processor 140 might be implemented as a Pentium®, Power PC® or ARM processor type (Pentium® is a registered trademark of Intel Corporation, ARM processors are by ARM Holdings, plc, and Power PC® is a registered trademark of IBM). Although shown in FIG. 1 as a single processor, control processor 140 might be implemented by multiple processors (not shown) and include software/firmware as needed for operation, including to perform threshold optimized operations in accordance with described embodiments.

Communication link 170 is used to communicate with host device 180, which might be a computer system that interfaces with solid state storage system 110. Communication link 170 might be a custom communication link, or might be a bus that operates in accordance with a standard communication protocol such as, for example, a Small Computer System Interface ("SCSI") protocol bus, a Serial Attached SCSI ("SAS") protocol bus, a Serial Advanced Technology Attachment ("SATA") protocol bus, a Universal Serial Bus ("USB"), an Ethernet link, an IEEE 802.11 link, an IEEE 802.15 link, or any other similar interface link for connecting a peripheral device to a computer.

Figure 2:
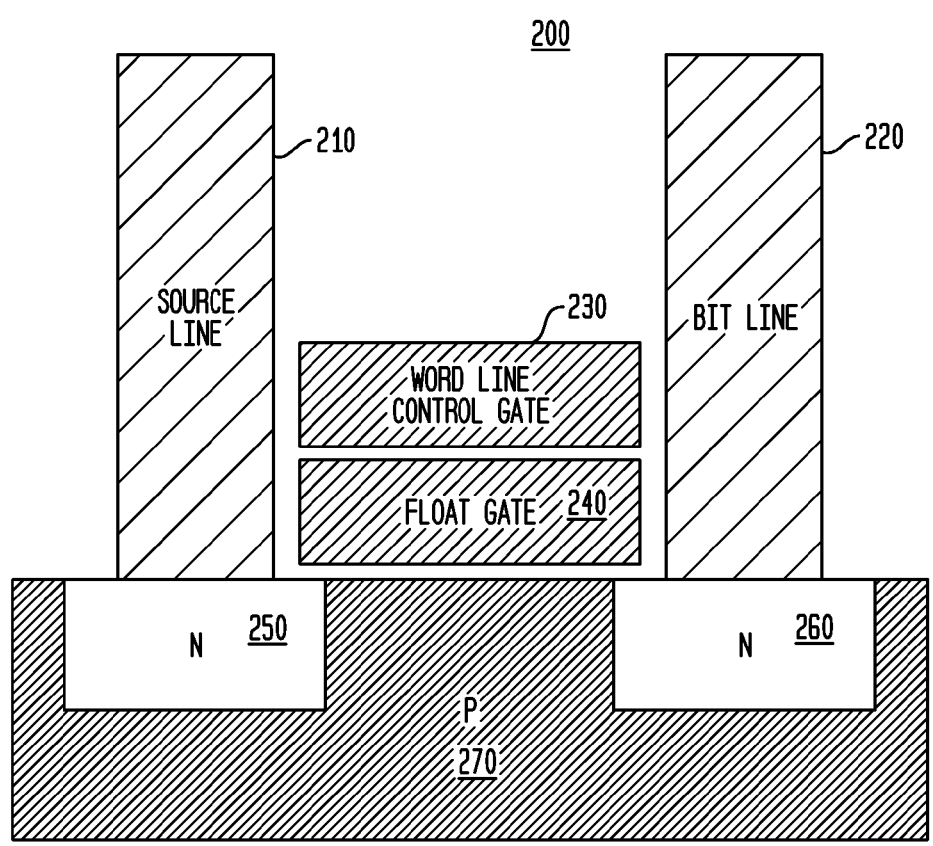
FIG. 2 shows an exemplary functional block diagram of a single standard flash memory cell.

FIG. 2 shows an exemplary functional block diagram of a single flash memory cell that might be found in solid state storage 110. Flash memory cell 200 is a MOSFET with two gates. The word line control gate 230 is located on top of floating gate 240. Floating gate 240 is isolated by an insulating layer from word line control gate 230 and the MOSFET channel, which includes N-channels 250 and 260, and P-channel 270. Because floating gate 240 is electrically isolated, any charge placed on floating gate 240 will remain and will not discharge, typically for many years. When floating gate 240 holds a charge, it partially cancels the electrical field from word line control gate 230 which modifies the threshold voltage of the cell. The threshold voltage is the amount of voltage applied to control gate 230 to allow the channel to conduct. The channel's conductivity determines the binary code stored in the cell. In multi-level cell, the amount of current flow is sensed in order to determine the precise charge on floating gate 240.

Figure 3:
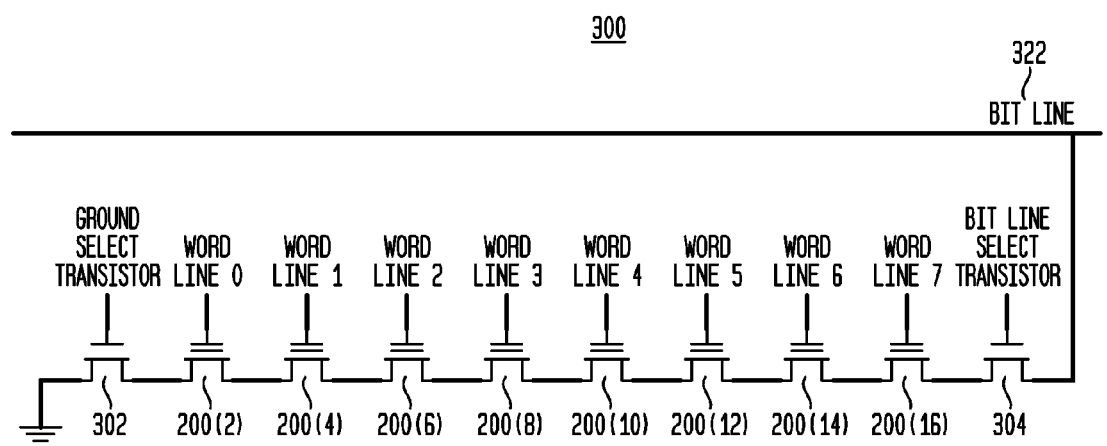
FIG. 3 shows an exemplary NAND MLC flash memory cell, in accordance with exemplary embodiments of the present invention.

FIG. 3 shows an exemplary NAND MLC flash memory cell 300 that might be found in solid state media 110. As shown in FIG. 3, flash memory cell 300 might include one or more word line transistors 200(2), 200(4), 200(6), 200(8), 200(10), 200(12), 200(14), and 200(16), and bit line select transistor 304 connected in series, drain to source. This series connection is such that ground select transistor 302, word line transistors 200(2), 200(4), 200(6), 200(8), 200(10), 200(12), 200(14) and 200(16), and bit line select transistor 304 are all "turned on" (e.g., in either a linear mode or a saturation mode) by driving the corresponding gate high in order for bit line 322 to be pulled fully low. Varying the number of word line transistors 200(2), 200(4), 200(6), 200(8), 200(10), 200(12), 200(14), and 200(16), that are turned on (or where the transistors are operating in the linear or saturation regions) might enable MLC cell 300 to achieve multiple voltage levels.

As described herein, in MLC NAND flash, each cell has a voltage charge level (e.g., an analog signal). A media controller might have a given number of predetermined voltage thresholds employed to read the voltage charge level and detect a corresponding binary value of the cell. For example, if there are 3 thresholds (0.1, 0.2, 0.3), when a cell voltage level is 0.0≤cell voltage<0.1, the cell might be decoded as having a binary value of [00]. If the cell voltage level is 0.1≤cell voltage<0.2, the binary value might be [01], and so on. Thus, described embodiments might compare a measured cell level to the thresholds one by one, until the cell level is determined to be in between two thresholds and can be decoded. Thus, binary data is provided to a decoder of memory controller 120 to decode the binary values into data to be provided to host device 180.

However, to employ Low-Density Parity-Check (LDPC) codes, "soft" data determined by a Log-Likelihood Ratio (LLR), or the precise charge level of the cells, is needed. Determining precise charge levels might typically require multiple cell level measurements that each compare the cell level to various thresholds. However, increasing the number of measurements degrades the throughput of the read operation of system 100. Thus, described embodiments minimize the number of measurements to recover the soft data by selecting the thresholds in an incremental cell level measurement scheme employing a Markov decision process (MDP), such that the number of measurements is minimized (in terms of maximizing entropy from measurements), and thus maximizing the throughput of a read operation of system 100.

Figure 4:
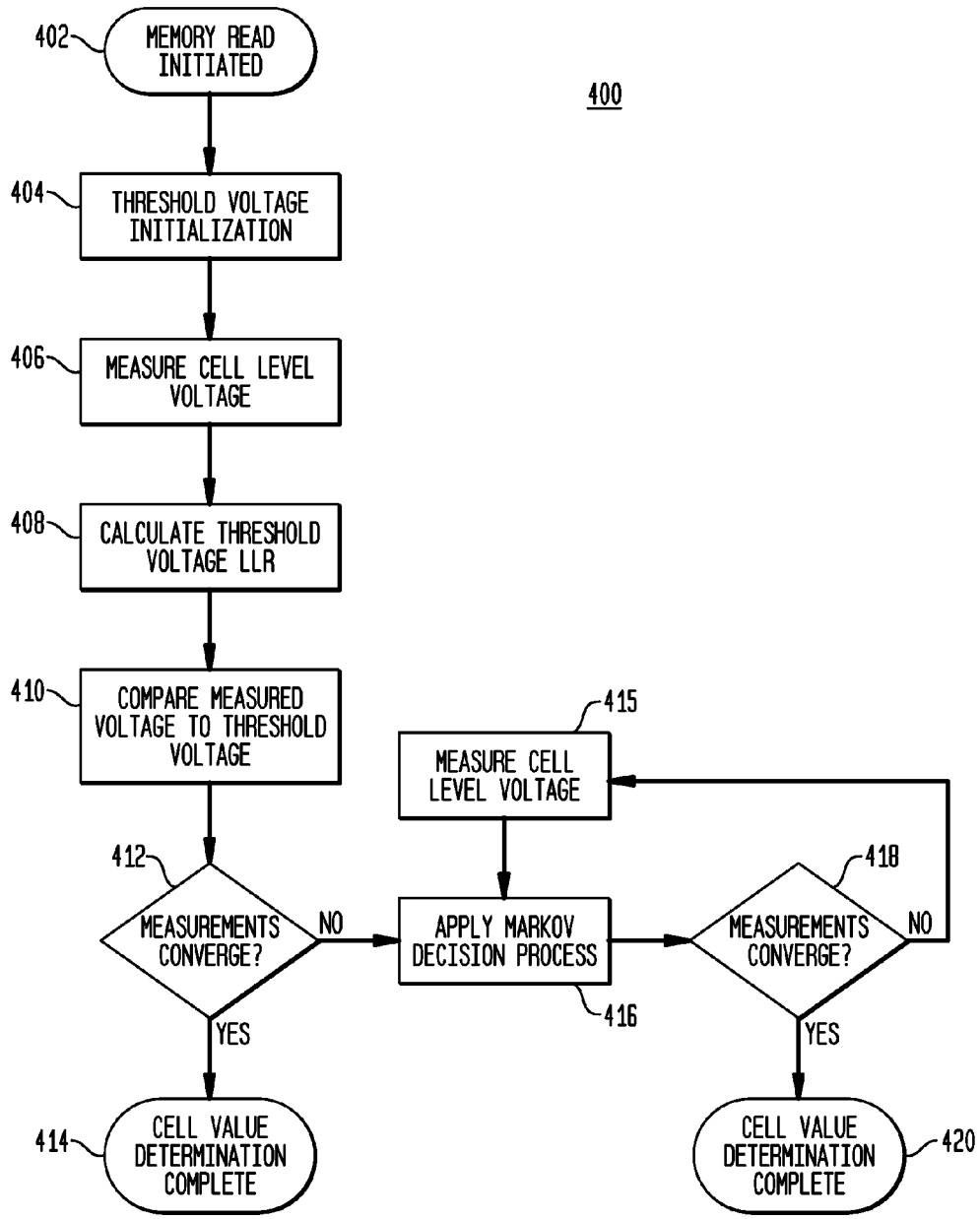
FIG. 4 shows an exemplary block diagram of the voltage measurement and cell logic value determination operation of the flash memory storage system of FIG. 1.

FIG. 4 shows an exemplary flow diagram of voltage measurement and cell logic value determination process 400. At step 402, control processor 140 initiates a memory read operation to solid state media 110. At step 404, control processor 140 selects one or more predetermined thresholds with which to compare the cell level measured at step 406. In some embodiments, one or more initial threshold values might be pre-calculated in a training mode of flash memory system 100 (e.g., by reading a known pattern from media 110). In other embodiments, the one or more threshold values might be set to predetermined levels (e.g., 0) and allowed to converge or adapt the threshold values during standard operation of system 100. Control processor 140 provides an indication of the initiated memory read operation to solid state controller 130, which, at step 406, measures the cell voltage level. At step 408, threshold voltage Log-likelihood ratio (LLR) is determined and, at step 410, the LLR value is compared to the measured cell level voltage (e.g., as measured at 406). If, at step 412, the measurements converge, or are substantially equivalent, then, at step 414, the cell value determination process 400 completes. If, at step 412, the measurements do not converge, then at step 416 a Markov Decision Process (MDP) is applied to the measurements. As described herein, the MDP is employed to determine optimized threshold values for detecting data from media 110. At step 418, if the MDP processed measurements converge on, or are substantially equivalent to, the measured cell voltage, then process 400 completes at step 420. If the measurements do not converge, MDP processing is repeated at step 416.

For a typical MLC, Gray coding might be employed to reduce the bit error rate (BER). An initial cell level voltage measurement (e.g., at step 406 of FIG. 4) might be performed by comparing the cell level with 3 thresholds, which might be calculated according to the cell level distribution to minimize the measurement error probability. If the cell level voltage measurement cannot converge on a decoded binary value, described embodiments might then select m threshold values based on the initial cell level voltage measurement (e.g., at step 406) and perform a second round of cell level measurement (e.g., at step 406). If the second measurement decoding cannot converge on a decoded binary value, another m thresholds might be selected based on the cell level value measured from the second measurement and perform a third measurement, and so on, iteratively until the cell level voltage measurement converges on a decoded binary value, or, optionally, until a maximum number of cell level measurement iterations is reached.

Thus, described embodiments implement an incremental cell voltage level measurement. A Markov decision process (MDP) might be employed to determine optimized threshold values at each stage (e.g., step 416) by solving the Bellman functions for the MDP.

An MDP introduces a human intervention, or "action" and optimizes a certain objective function, or "reward function" induced by state transitions. In described embodiments, the MDP is a 4-tuple given by relation (1):

$$\{S, A, P(\ldots, \ldots), R(\ldots, \ldots)\} \quad (1)$$

where S is the set of states, A is the set of available actions, where P(s, s') is given by relation (2):

$$Ps(s,s') = (s_{t+1} = s' | s_t = s, a_t = a) \quad (2)$$

where P(s,s') is the probability of a state transition from state s to state s', given action a is taken, and $R_a(s, s')$ is the immediate reward received from state transition s to s'. The objective function (3):

$$\sum_{t=0}^{\infty} \gamma R_{a_t}(s_t, s_{t+1}) \quad (3)$$

s the weighted accumulative reward used to determine a relative best action to take, $a_t = \pi(s_t)$, given a current state, $s_t$.

In the MDP of described embodiments, state set S is defined as the value measured from a previous cell level voltage measurement (e.g., at step 406). Action set A is defined as the set of possible threshold values for a next measurement (e.g., at step 416). Reward function $R_a(s,s')$ is defined as a conditional entropy of the incremental measurement given previous measurements and the probability distribution of possible cell levels. In described embodiments, the discount factor might be set as γ=1 (e.g., no discount). In some embodiments, the state transition probability $P_a(s,s')$ might be pre-calculated in a training mode of flash memory system 100 (e.g., at step 404 of FIG. 4).

By solving the value iteration given in relation (4):

$$V(s) = \mathop{Max}_{a} \left\{ \sum_{s''} P_a(s, s')(R_a(s, s') + \gamma V(s, s')) \right\} \quad (4)$$

and the policy iteration given in relation (5):

$$\pi(s) = \mathop{argmax}_{a} \left\{ \sum_{s'} P_a(s, s')(R_a(s, s') + \gamma V(s, s')) \right\} \quad (5)$$

the optimal action $a_t = \pi(s_t)$, given state $s_t$, is determined. This optimal action maximizes the total reward, which reduces the probability of errors in reading data from solid state media 110 (e.g., reduces the BER).

Figure 5:
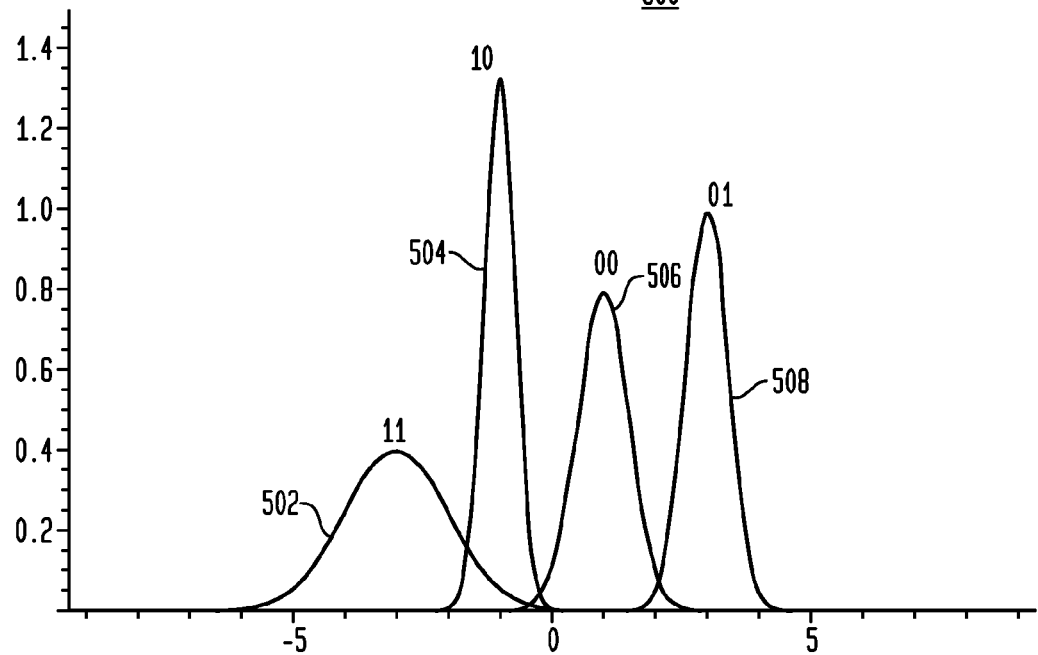
FIG. 5 shows a Gaussian distribution with different mean and standard deviation for each voltage level of the MLC flash memory cell of FIG. 2.

FIG. 5 shows a Gaussian distribution with different mean and standard deviation for each voltage level of the MLC flash memory cell of FIG. 2. This Gaussian distribution might be, for example, a representation of the output of threshold voltage initialization at step 404 of FIG. 4.

Figure 6:
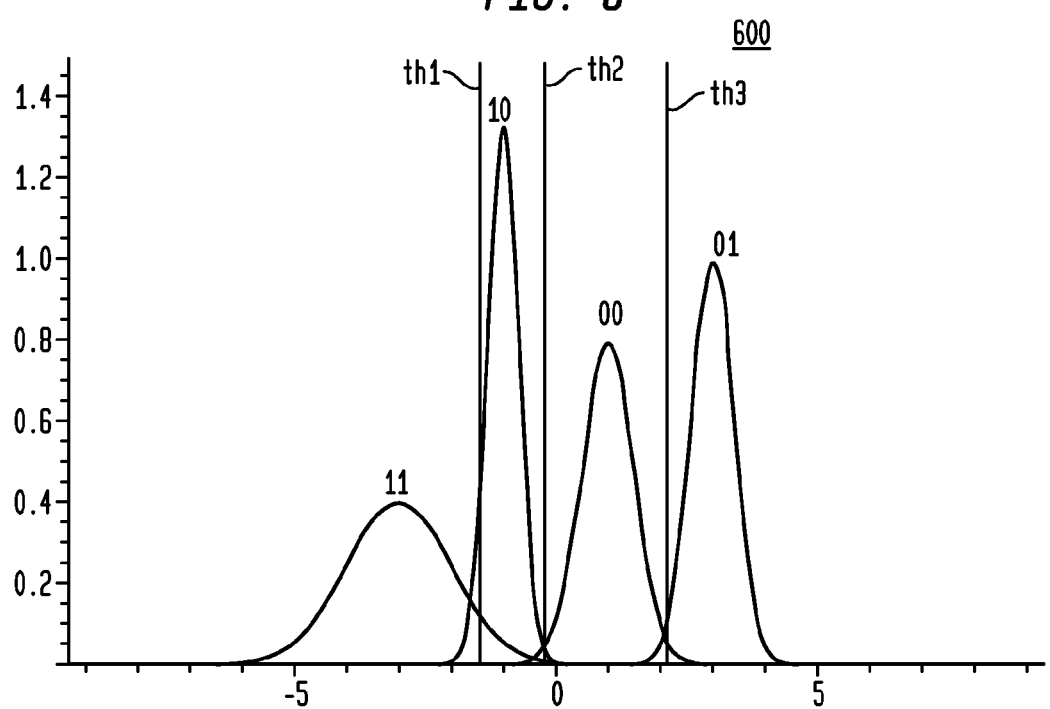
FIG. 6 shows an exemplary plot of the Gaussian distribution of FIG. 5, showing the initial voltage thresholds.

FIG. 6 shows an exemplary plot of the Gaussian distribution of FIG. 5, showing the initial voltage thresholds, for example resulting from the output of calculating a threshold voltage LLR at step 408 of FIG. 4.

Figure 7:
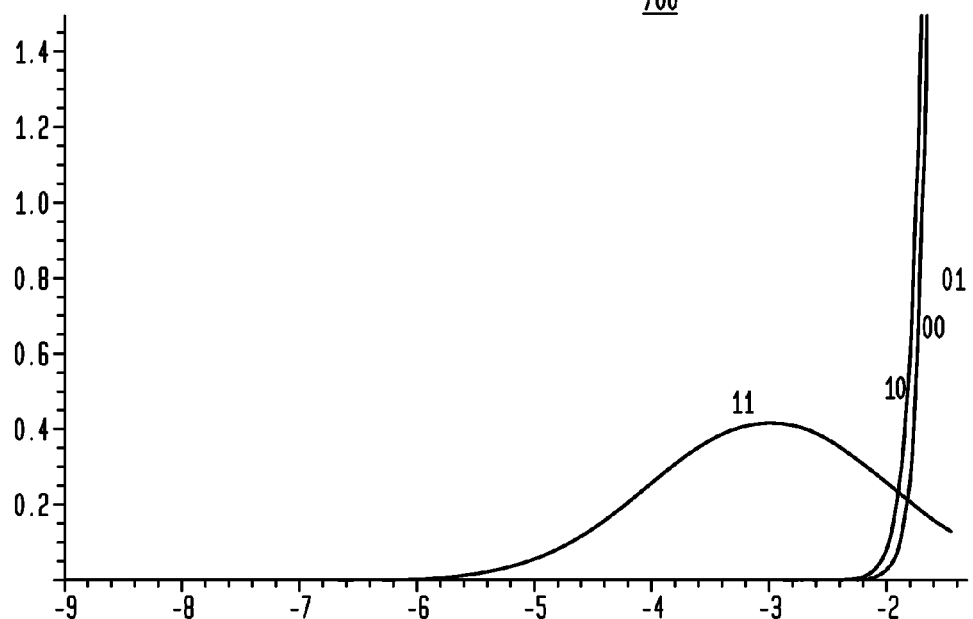
FIG. 7 shows an exemplary plot of the Gaussian distribution of FIG. 5, showing the threshold optimization for a second voltage measurement relating to a first voltage threshold.

FIG. 7 shows an exemplary plot of the Gaussian distribution of FIG. 5, showing the threshold optimization for a second voltage measurement relating to a first voltage threshold resulting from the initial Markov Decision Process performed at step 416 of FIG. 4.

Figure 8:
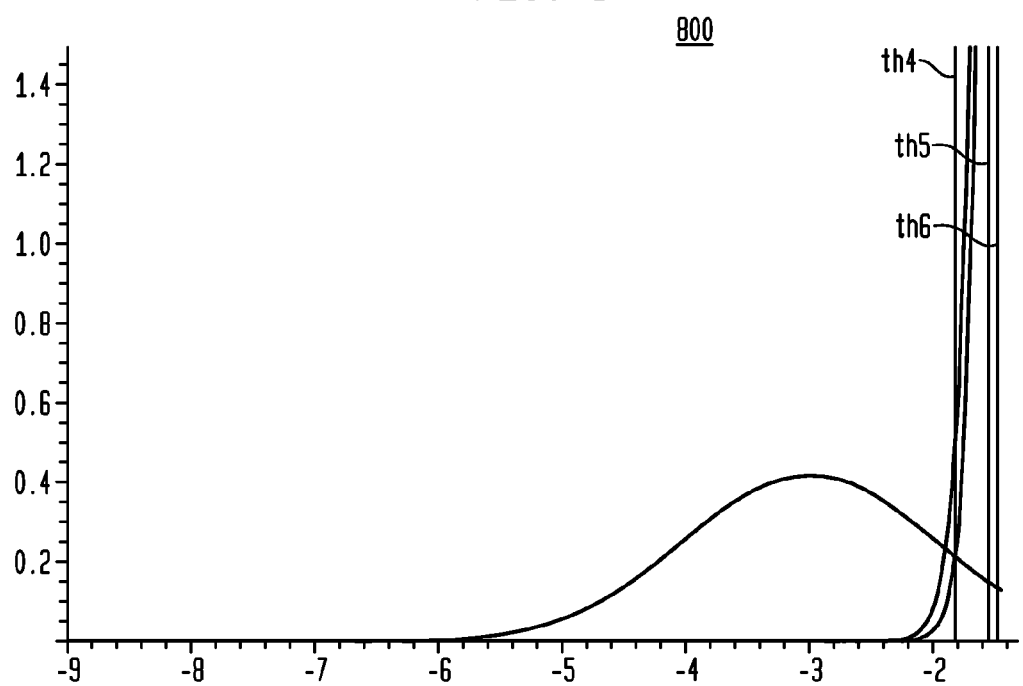
FIG. 8 shows an exemplary plot of the Gaussian distribution of FIG. 5, showing the threshold optimization for a second measurement relating to multiple voltage thresholds.

FIG. 8 shows an exemplary plot of the Gaussian distribution of FIG. 5, showing the threshold optimization for a second measurement relating to multiple voltage thresholds, possibly from a second or subsequent application of a Markov Decision Process performed at step 416 of FIG. 4.

As described herein, embodiments provide a method of enhancing the memory read accuracy of multi-level cell NAND flash memory is provided. The cell level voltages might be measured multiple times and compared to one or more thresholds. In the event that the measurements and thresholds do not converge, a Markov Decision Process (MDP) is applied incrementally until convergence, reducing memory read errors.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processing blocks in a software program, including possible implementation as a digital signal processor, micro-controller, or general purpose computer, the present invention is not so limited. As would be apparent to one skilled in the art, various functions of software may also be implemented as processes of circuits. Such circuits may be employed in, for example, a single integrated circuit, a multi-chip module, a single card, or a multi-card circuit pack.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A method of enhancing memory read accuracy of a multi-level cell flash memory, the method comprising:
    receiving, by a media controller coupled to the multi-level cell flash memory, a read request from a host device coupled to the media controller, the read request corresponding to one or more desired cells of the multi-level cell flash memory;
    setting, by the media controller, m threshold levels to initial values, each of the threshold levels corresponding to a cell voltage level of the multi-level cell flash memory, m a positive integer;
    measuring the cell voltage level of a given desired cell;
    iteratively, for each of the one or more desired cells of the multi-level cell flash memory, until the measured cell voltage level converges on one of the threshold levels:
        determining a Log-likelihood ratio (LLR) of each threshold voltage;
        comparing the determined LLR of each threshold voltage to the measured cell voltage level;
        if the measured cell voltage level does not converge on one of the m threshold level:
            updating, by the media controller, one or more of the m threshold levels based on a Markov decision process;
            remeasuring the cell voltage level; and
            comparing the remeasured cell voltage level to the updated m threshold levels;
    once the measured cell voltage level converges on one of the m threshold levels:
        determining a binary level corresponding to the measured cell level voltage based on the corresponding one of the m threshold levels; and
    providing the determined binary level as an output of the multi-level cell flash memory.

2. The method of claim 1, wherein the Markov decision process comprises:
    determining a probability that a given threshold is reached for the cell voltage measurement;
    determining a reward function based on the determined probability,
    determining a weighted accumulative reward based on the determined reward function; and
    determining, based on the weighted accumulative reward, updated values for the m threshold levels.

3. The method of claim 2, wherein:
    the probability is determined by $Ps(s, s')=(s_{t+1}=s'|s_t=s, a_t=a)$, wherein $P(s,s')$ is the probability of a state transition from state s to state s', where state s and state s' are members of a set, S, of possible states, and set S is a set of cell voltage levels measured from a previous cell level voltage measurement, and where a is a member of a set, A, of possible actions, where set A corresponds to a set of possible threshold values for a remeasurement of the cell voltage level.

4. The method of claim 3, wherein:
    the reward function, $R_a(s,s')$, is determined based on conditional entropy of incremental measurements given previous cell voltage level measurements and a probability distribution of possible cell voltage levels.

5. The method of claim 4, wherein:
    the weighted accumulative reward is determined by $$\sum_{t=0}^{\infty} \gamma R_{a_t}(s_t, s_{t+1}),$$

where γ is a discount factor of the reward, where $a_t$ is a relative best action corresponding to current state $s_t$.

6. The method of claim 5, wherein:
    the relative best action is determined by $$\pi(s) = \underset{a}{argmax}\left\{\sum_{s'} P_a(s, s')(R_a(s, s') + \gamma V(s, s'))\right\},$$

where $$V(s) = \underset{a}{Max}\left\{\sum_{s''} P_a(s, s')(R_a(s, s') + \gamma V(s, s'))\right\},$$

where optimal action $a_t = \pi(s_t)$ for given state $s_t$, wherein the determined optimal action $a_t$ maximizes the weighted accumulative reward, thereby reducing the bit error ratio (BER) of read operations from multi-level cell flash memory.

7. The method of claim 1, further comprising:
determining the initial values of each of the m threshold levels during a training mode of the media controller, the training mode comprising reading a predetermined pattern from an associated area of one or more cells of the multi-level flash memory.

8. The method of claim 1, wherein m is equal to 3.

9. The method of claim 8, wherein the step of determining a binary level corresponding to the measured cell level voltage based on the corresponding m threshold levels comprises:
if the measured cell level voltage has not reached a first threshold, determining the binary level to be [00];
if the measured cell level voltage has reached the first threshold but has not reached a second threshold, determining the binary level to be [01];
if the measured cell level voltage has reached the second threshold but has not reached a third threshold, determining the binary level to be [10]; and
if the measured cell level voltage has reached the third threshold, determining the binary level to be [11].

10. The method of claim 1, wherein, for the method, the multi-level cell flash memory is a triple level cell NAND flash memory.

11. A non-transitory machine-readable medium, having encoded thereon program code, wherein, when the program code is executed by a machine, the machine implements a method of enhancing memory read accuracy of a multi-level cell flash memory, the method comprising:
receiving, by a media controller coupled to the multi-level cell flash memory, a read request from a host device coupled to the media controller, the read request corresponding to one or more desired cells of the multi-level cell flash memory;
setting, by the media controller, m threshold levels to initial values, each of the threshold levels corresponding to a cell voltage level of the multi-level cell flash memory, m a positive integer;
measuring the cell voltage level of a given desired cell;
iteratively, for each of the one or more desired cells of the multi-level cell flash memory, until the measured cell voltage level converges on one of the threshold levels:
determining a Log-likelihood ratio (LLR) of each threshold voltage;
comparing the determined LLR of each threshold level to the measured cell voltage level;
if the measured cell voltage level does not converge on one of the m threshold levels:
updating, by the media controller, one or more of the m threshold levels based on a Markov decision process;
remeasuring the cell voltage level; and
comparing the remeasured cell voltage level to the updated m threshold levels;
once the measured cell voltage level converges on one of the m threshold levels:
determining a binary level corresponding, to the measured cell level voltage based on the corresponding one of the m threshold levels; and
providing the determined binary level as an output of the multi-level cell flash memory.

12. The non-transitory machine-readable medium of claim 11, wherein the Markov decision process comprises:
determining a probability that a given threshold is reached for the cell voltage measurement;
determining a reward function based on the determined probability,
determining a weighted accumulative reward based on the determined reward function; and
determining, based on the weighted accumulative reward, updated values for the m threshold levels;
wherein the probability is determined by $Ps(s, s')=(s_{t+1}=s'|s_t=s, a_t=a)$, wherein $P(s,s')$ is the probability of a state transition from state s to state s', where state s and state s' are members of a set, S of possible states, and set S is a set of cell voltage levels measured from a previous cell level voltage measurement, and where a is a member of a set, A, of possible actions, where set A corresponds to a set of possible threshold values for a remeasurement of the cell voltage level; and
wherein the reward function, $R_a(s,s')$, is determined based on conditional entropy of incremental measurements given previous cell voltage level measurements and a probability distribution of possible cell voltage levels.

13. The non-transitory machine-readable medium of claim 12, wherein:
the weighted accumulative reward is determined by $$\sum_{t=0}^{\infty} \gamma R_{a_t}(s_t, s_{t+1}),$$

where γ is a discount factor of the reward, where $a_t$ is a relative best action corresponding to current state $s_t$; and
the relative best action is determined by $$\pi(s) = \underset{a}{argmax}\left\{\sum_{s'} P_a(s, s')(R_a(s, s') + \gamma V(s, s'))\right\},$$

where $$V(s) = \underset{a}{Max}\left\{\sum_{s''} P_a(s, s')(R_a(s, s') + \gamma V(s, s'))\right\},$$

where optimal action $a_t = \pi(s_t)$ for given state $s_t$, wherein the determined optimal action $a_t$ maximizes the weighted accumulative reward, thereby reducing the bit error ratio (BER) of read operations from multi-level cell flash memory.

14. The non-transitory machine-readable medium of claim 11, further comprising:
determining the initial values of each of the m threshold levels during a training mode of the media controller, the training mode comprising reading a predetermined pattern from an associated area of one or more cells of the multi-level flash memory, wherein m is equal to 3, and wherein the step of determining a binary level corresponding to the measured cell level voltage based on the corresponding m threshold levels comprises:
if the measured cell level voltage has not reached a first threshold, determining the binary level to be [00];
if the measured cell level voltage has reached the first threshold but has not reached a second threshold, determining the binary level to be [01];
if the measured cell level voltage has reached the second threshold but has not reached a third threshold, determining the binary level to be [10]; and
if the measured cell level voltage has reached the third threshold, determining, the binary level to be [11].

15. The non-transitory machine-readable medium of claim 11, wherein the multi-level cell flash memory is a triple level cell NAND flash memory.

16. The non-transitory machine-readable medium of claim 11, wherein:
the host device is coupled to the media controller by at least one of a Small Computer System Interface ("SCSI") link, a Serial Attached SCSI ("SAS") link, a Serial Advanced Technology Attachment ("SATA") link, a Universal Serial Bus ("USB") link: a Fibre Channel ("FC") link, an Ethernet link, an IEEE 802.11 link, an IEEE 802.15 link, an IEEE 802.16 link, and a Peripheral Component Interconnect Express (PCI-E) link; and
the media controller is implemented as an integrated circuit chip.

* * * * *